(12) United States Patent
Wang et al.

(10) Patent No.: US 10,158,061 B2
(45) Date of Patent: Dec. 18, 2018

(54) INTEGRATED SUPERCONDUCTOR DEVICE AND METHOD OF FABRICATION

(71) Applicant: Varian Semiconductor Equipment Associates, Inc., Gloucester, MA (US)

(72) Inventors: Connie P. Wang, Mountain View, CA (US); Paul Murphy, Reading, MA (US); Paul Sullivan, Wenham, MA (US)

(73) Assignee: VARIAN SEMICONDUCTOR EQUIPMENT ASSOCIATES, INC, Gloucester, MA (US)

( * ) Notice: Subject to any disclaimer, the term of this patent is extended or adjusted under 35 U.S.C. 154(b) by 738 days.

(21) Appl. No.: 14/163,790

(22) Filed: Jan. 24, 2014

(65) Prior Publication Data

US 2016/0163424 A1 Jun. 9, 2016

Related U.S. Application Data

(60) Provisional application No. 61/903,110, filed on Nov. 12, 2013.

(51) Int. Cl.
*H01L 39/16* (2006.01)
*H01L 39/24* (2006.01)

(52) U.S. Cl.
CPC .......... *H01L 39/16* (2013.01); *H01L 39/2432* (2013.01); *H01L 39/2461* (2013.01); *H01L 39/2467* (2013.01)

(58) Field of Classification Search
CPC ............................ H01L 39/16; H01L 39/2432
See application file for complete search history.

(56) References Cited

U.S. PATENT DOCUMENTS

| | | | | |
|---|---|---|---|---|
| 4,964,945 A | * | 10/1990 | Calhoun | C23C 14/042 216/106 |
| 4,999,597 A | | 3/1991 | Gaynor | |
| 5,407,903 A | * | 4/1995 | Nakamura | H01L 39/146 257/36 |
| 5,468,973 A | * | 11/1995 | Harada | H01L 39/225 257/33 |
| 5,547,922 A | | 8/1996 | Ma | |
| 5,672,569 A | | 9/1997 | Nakamura et al. | |
| 5,828,291 A | | 10/1998 | Baumann et al. | |
| 5,968,877 A | * | 10/1999 | Budai | C21D 8/12 505/237 |

(Continued)

FOREIGN PATENT DOCUMENTS

| | | |
|---|---|---|
| EP | 0358879 A2 | 3/1990 |
| GB | 2250517 A | 6/1992 |

(Continued)

*Primary Examiner* — Paul A Wartalowicz

(57) ABSTRACT

In one embodiment, a method to form a superconductor device includes depositing a crystalline layer having a preferred crystallographic orientation on a substrate and forming an oriented superconductor layer comprising an oriented superconductor material on the crystalline layer. A metallic layer is formed on the superconductor layer and a mask is provided proximate the substrate to define a protected portion of the oriented superconductor layer and an exposed portion of the oriented superconductor layer. The exposed portion of the oriented superconductor layer is removed without etching the protected portion of the oriented superconductor layer.

13 Claims, 6 Drawing Sheets

(56) References Cited

U.S. PATENT DOCUMENTS

| | | | |
|---|---|---|---|
| 2001/0007707 A1 | 7/2001 | Kinder et al. | |
| 2004/0168636 A1 | 9/2004 | Savvides et al. | |
| 2006/0057240 A1* | 3/2006 | Koinuma | C23C 14/044 425/223 |
| 2007/0139976 A1* | 6/2007 | deRochemont | B82Y 30/00 363/17 |
| 2007/0148330 A1* | 6/2007 | Xiong | H01L 39/2461 427/62 |
| 2007/0197045 A1 | 8/2007 | Backer et al. | |
| 2007/0197395 A1 | 8/2007 | Kodenkandath et al. | |
| 2008/0210454 A1* | 9/2008 | Fee | H01F 6/06 174/125.1 |
| 2009/0086386 A1 | 4/2009 | Sargent et al. | |
| 2009/0233798 A1* | 9/2009 | Maeda | G01R 33/035 505/190 |
| 2009/0298697 A1* | 12/2009 | Zhang | H01L 39/143 505/231 |
| 2010/0160169 A1* | 6/2010 | Hahakura | H01L 39/143 505/230 |
| 2011/0160066 A1 | 6/2011 | Aytug et al. | |
| 2011/0319271 A1 | 12/2011 | Selvamanickam et al. | |
| 2012/0181062 A1 | 7/2012 | Neumuller et al. | |
| 2012/0238454 A1 | 9/2012 | Yoshizumi et al. | |
| 2013/0137579 A1 | 5/2013 | Nagasu et al. | |
| 2014/0038829 A1* | 2/2014 | Hanafusa | H01L 39/143 505/237 |

FOREIGN PATENT DOCUMENTS

| | | | | |
|---|---|---|---|---|
| JP | 01163917 A | 6/1989 | | |
| JP | H0284732 A | 3/1990 | | |
| JP | 02192175 A | 7/1990 | | |
| JP | 4167577 A | 6/1992 | | |
| JP | 10182292 A | 7/1998 | | |
| JP | 2008118121 A | 5/2008 | | |
| JP | 2013503422 A | 1/2013 | | |
| WO | 9915719 A1 | 4/1999 | | |
| WO | WO 2012/165109 | * | 6/2012 | H01B 12/06 |
| WO | 2012165504 A1 | 12/2012 | | |

* cited by examiner

INTEGRATED SUPERCONDUCTOR DEVICE AND METHOD OF FABRICATION

RELATED APPLICATIONS

This application claims priority to U.S. provisional patent application No. 61/903,110 filed Nov. 12, 2013.

FIELD

The present embodiments relate to superconducting materials and, more particularly, to integrated superconductor devices.

BACKGROUND

Superconducting wires or tapes have been developed based upon high temperature superconducting (HTc) materials which may have critical temperatures TC above 77 K, facilitating their use in cryogenic systems cooled by liquid nitrogen. In certain applications, such as use in superconducting fault current limiters (SCFCL), high temperature superconducting (HTS) tapes may experience high temperature excursions in the case of a fault, in which the superconducting layer undergoes a transition to non-superconducting state. To accommodate faults HTS tapes include a stack of one or more metal layers that can conduct excess electrical current when a superconductor layer becomes non-superconducting.

The synthesis of HTS tapes involves many challenges including the need to form a complex stack of materials that constitute the HTS tape. Often, a superconductor layer of the superconductor tape is formed on a metallic substrate that is in the form of a ribbon or tape structure which serves as the template for growth of necessary layers for forming the superconductor tape. The metallic substrate is often processed by drawing the tape through a series of deposition and processing chambers that are used to form the multiple layers on the metallic tape. In order to provide sufficient current carrying capabilities in the resultant superconductor tape, the crystalline superconductor material is grown in a manner to promote a specific crystallographic orientation or "texture" of the resulting layer. The conventional HTS crystalline superconductor material is chosen from a class of layered complex oxides, in which current carrying copper oxide layers are oriented within a plane perpendicular to the c-axis of the crystallographic unit cell. Accordingly, it is desirable to form a c-axis texture of the superconductor tape in which the current carrying layers of the superconductor tape lie parallel to the plane of the tape. This entails the deposition of at least one intermediate layer, and often several layers, that separate the metallic tape substrate from the superconductor layer. The intermediate layers may play multiple roles including use as a diffusion barrier to prevent interdiffusion of the metallic tape material and superconductor layer, as well as use as a crystalline template from which a highly crystallographically oriented superconductor layer can be grown.

To achieve desired conduction properties, a superconductor layer thickness of two micrometers or greater may be required, which may result in excessive strain in such a layer, reducing the mechanical integrity of the superconductor layer. After formation of the superconductor layer, a metallic overlayer may be formed on the superconductor layer to serve as a conductive layer to conduct current during a fault condition in which the superconductor layer is in a non-superconducting state. Once the complete stack of layers that constitutes a superconductor tape is formed, the tape may be assembled into a current limiter by fastening tape portions together to form a set of multiple, extended, conductive paths. The tape portions are mounted in a module that provides mechanical strength and convenient handling of the superconductor tapes for assembly into a current limiter device. In view of the above it may be appreciated that the formation of superconductor tapes, in particular for current limiter applications, requires extensive and complex processing. It is with respect to these and other considerations that the present improvements are needed.

BRIEF SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a method to form a superconductor device, includes depositing a crystalline layer having a preferred crystallographic orientation on a substrate; forming an oriented superconductor layer comprising an oriented superconductor material on the crystalline layer; forming a metallic layer on the superconductor layer; providing a mask proximate the substrate to define a protected portion of the oriented superconductor layer and an exposed portion of the oriented superconductor layer; and removing the exposed portion of the oriented superconductor layer without etching the protected portion of the oriented superconductor layer. In a further embodiment a method for forming a superconductor device includes forming a crystalline layer having a preferred crystallographic orientation on a substrate; providing a mask proximate a surface of the crystalline layer, the mask comprising an open area; and directing superconductor precursors through open areas of the mask to the substrate to the crystalline layer.

In another embodiment, a method to form a superconductor device includes forming a crystalline layer having a preferred crystallographic orientation on a substrate; providing a mask proximate a surface of the crystalline layer, the mask comprising an open area; and directing superconductor precursors through open areas of the mask to the substrate to the crystalline layer.

In another embodiment, a superconductor device includes a substrate base, a crystalline layer having a preferred crystallographic orientation is disposed on the substrate base and an integrated superconductor tape structure is arranged on the substrate base. The integrated superconductor tape structure may include an oriented superconductor layer disposed on the crystalline layer and a metal layer disposed on a side of the oriented superconductor layer opposite that of the substrate base.

DETAILED DESCRIPTION

Figure 1A:
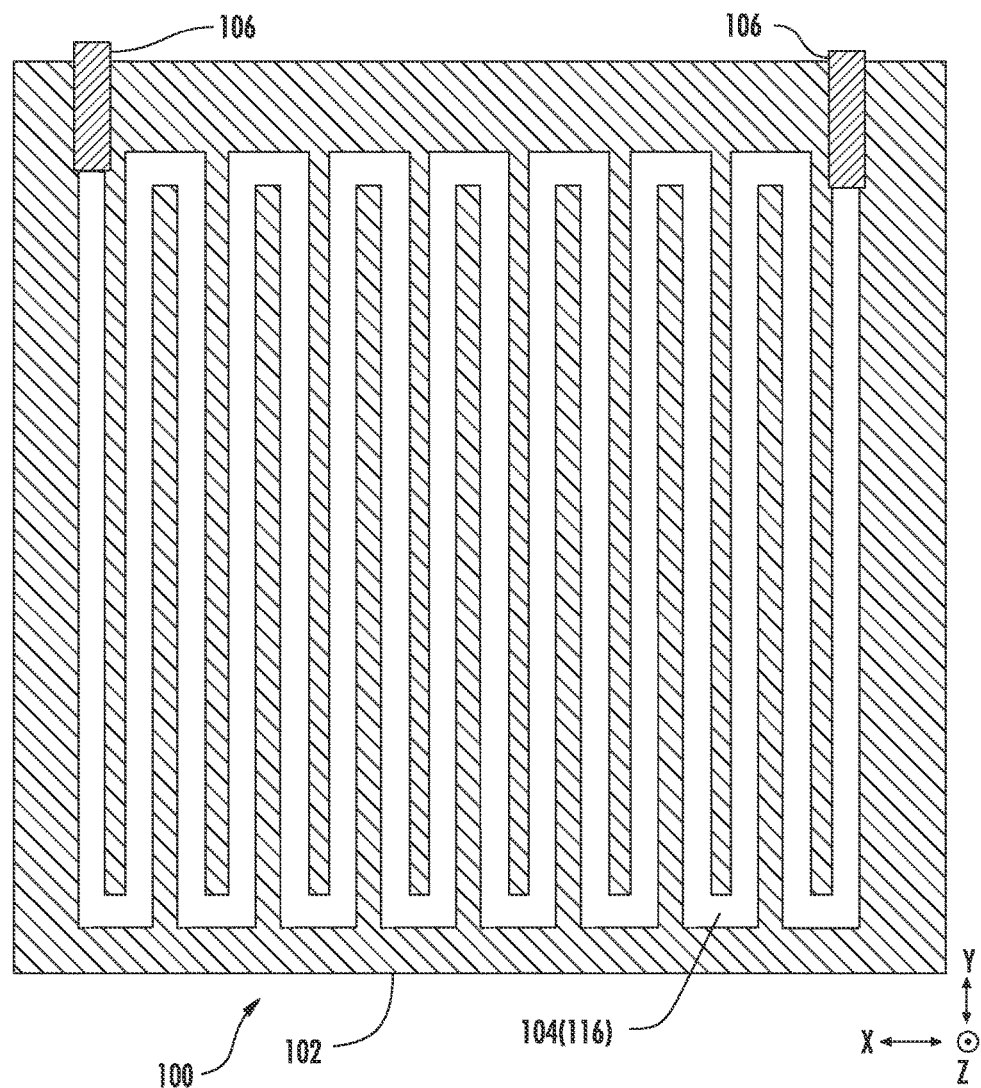
FIG. 1A and FIG. 1B depict a respective plan view and side cross-sectional view of an integrated superconductor device consistent with the present embodiments.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

To address some of the deficiencies in the aforementioned superconductor tapes, embodiments are described herein that provide improved methods for fabricating superconductor layers and superconductor tapes, as well as improved structure for superconductor tapes. Among other applications, these embodiments may be suited to applications of superconductor tapes are used to conduct current over a long current path arranged within a compact device, including current limiting devices.

To address problems of conventional superconductor tape fabrication, the present embodiments in particular provide a superconductor device that has an integrated superconductor device structure that includes a superconductor tape integrated into a substrate base. The present embodiments further provide fabrication techniques to generate a superconductor tape configuration that overcomes complexity associated with manufacture of stand-alone superconductor tapes. The resultant integrated superconductor devices effectively incorporate superconductor structures that are similar to tapes but are formed directly upon a large area substrate that occupies more surface area than that occupied by the superconductor structures. Thus, the integrated superconductor devices are characterized by a substrate that contains superconductor and non-superconductor regions across its surface. Although not formed as standalone tapes, such superconductor structures may be referred to herein as "tapes" because of the similarity of the morphology of the superconductor structures to conventional tapes.

In addition, the terms "superconductor" "superconductor element" or "superconductor material" as used herein, refer to a substance or object that has the capability of conducting electrical current without resistance. Thus a material such as $YBa_2Cu_3O_{7-x}$ (also referred to herein as "YBCO") may be referred to as a superconductor or superconductor material even when subject to a room temperature environment in which the material is not superconducting, since YBCO does become superconducting at temperatures below 91 K.

The terms "superconducting" or "superconducting layer" on the other hand, are used herein to refer to properties of a tape or material. Thus, YBCO is superconducting under certain conditions, such as temperatures below 91 K or when current conducted by the YBCO material is below a critical current. Moreover, the term "non-superconducting" and "non-superconducting state" as used herein both refer to the state of a superconductor material in which the superconductor material does not have superconducting properties, such as when the superconductor material is subject to room temperature ambient.

In addition, the term "non-superconductor" as used herein, may refer to a material that is not capable of being superconducting. For example, a non-superconductor may include a material derived from a superconductor material such as YBCO, in which the material is altered, either chemically or structurally, from the parent superconductor material in a manner to render it incapable of becoming superconducting. Thus, a superconductor material may exist in superconducting state or non-superconducting state depending on conditions including temperature, electrical current density for current being conducted by the superconductor material, and the magnetic field applied to the material, etc. A non-superconductor material, on the other hand, may exist in a non-superconducting state regardless of temperature or other factors.

Finally, the terms "superconductor tape" and "superconductor layer" as used herein refer to tape, a tape-like structure or layer in which at least a portion of the respective tape-like structure or layer contains a superconductor material. Thus, a "superconductor tape" may include one or more layers of superconductor material and optionally one or more layers of non-superconductor material. Similarly, a "superconductor layer," after patterning, for example, may contain a portion that is made of superconductor material, and a portion in which the material is not a superconductor.

Figure 1B:
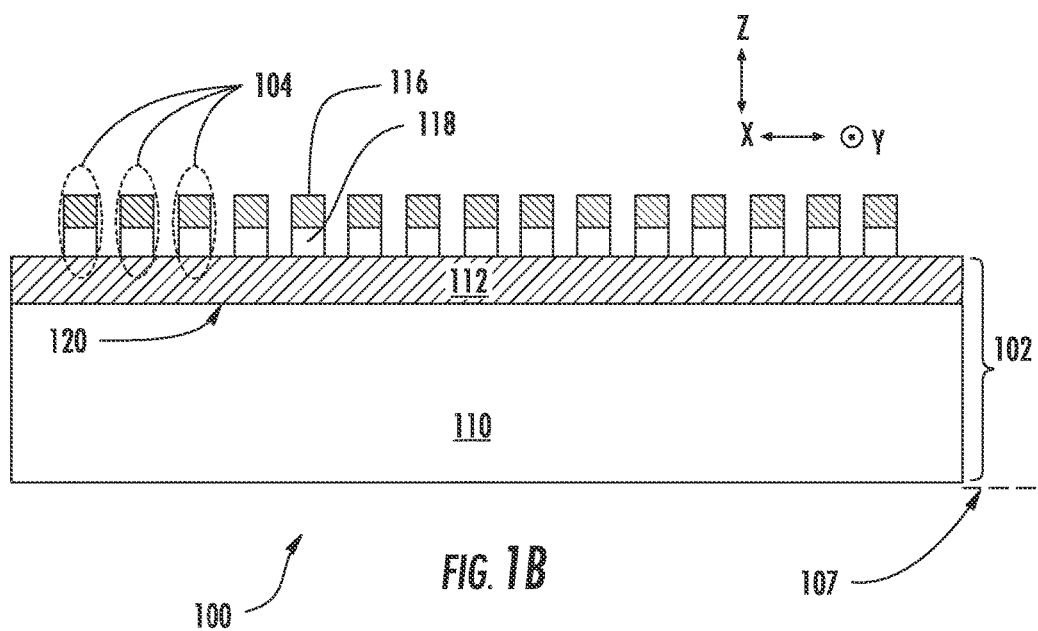

FIG. 1A and FIG. 1B depict a respective plan view and side cross-sectional view of an integrated superconductor device 100 consistent with the present embodiments. One characteristic feature of the integrated superconductor device 100 is that a superconductor tape 104 is integrated into the substrate 102. In particular the superconductor tape 104 is fabricated by depositing at least one layer on a substrate base 110, and thereafter defining a tape structure of the superconductor tape 104 that is formed within or upon the at least one layer. This process results in a unitary structure of the integrated superconductor device 100 in which the superconductor tape 104 is an integral part.

As illustrated in FIG. 1A, a superconductor tape 104 is arranged in a serpentine structure within the X-Y plane of the Cartesian coordinate system shown, which lies within the plane of the substrate 102. The structure of the superconductor tapes 104 serves to define a relatively long current path for current conducted between respective contacts 106 that are disposed at opposite ends of the superconductor tape 104. In other words, in comparison to a width of the integrated superconductor device 100 along the X- direction, the current path length between respective contacts 106 may be many times longer. The integrated superconductor devices 100 may be suited for applications such as current limiter of a superconducting fault current limiter. However, the embodiments are not limited in this context.

Turning to FIG. 1B, in accordance with various embodiments, the substrate base 110 may be a glass material, a polycrystalline material, or a single crystalline material. Examples of a polycrystalline material include alumina while examples of a single crystalline material include monocrystalline silicon or sapphire. The embodiments are not limited in this context. In some embodiments, the substrate base 110 may present a low roughness surface, such as is characteristic of glass substrates or single crystalline substrates. Moreover, the substrate base 110 may present few if any grain boundaries on its surface 120, thereby facilitating growth of a smoother layer stack. In the present embodiments an intermediate layer is disposed between the substrate base and a superconductor layer. The intermediate layer is a crystalline layer that is represented in FIG. 1B by the layer 112, which is disposed on the substrate base 110. In some embodiments the layer 112 may include multiple sub-layers (referred to herein simply as layers) or a single layer. The layer 112 in particular includes at least one layer that exhibits preferred crystallographic orientation and is disposed in a top portion of the layer 112. The term "preferred crystallographic orientation" refers to a quality of the microstructure of the layer in which crystallites of the layer have a non-random distribution of orientations such that certain crystallographic directions are preferentially oriented perpendicularly to a plane 107 of the substrate 102 as compared to the orientation of crystallites in a random polycrystalline powder. The top of layer 112 may in particular serve as a template for growth of a high quality superconductor layer 114 as detailed below.

As further shown in FIG. 1B the structure of the superconductor tape 104 includes a metal structure 116 which covers a superconductor structure 118. As shown in FIG. 1A, the metal structure 116 may form a conductive strip that has a serpentine structure so that the superconductor structure 118 has a similar serpentine structure. The resultant structure of the integrated superconductor device 100 comprises a serpentine superconductor tape that includes a metal overlayer, metal structure 116, and a superconductor underlayer, superconductor structure 118. Some exemplary widths $d_M$ for the metal structure 116 may range from 1 mm to 20 mm. As illustrated in FIG. 1A and FIG. 1B the metal structure 116 may define a long conductive path by having a serpentine shape. For example, in a 300 mm×300 mm square substrate, a serpentine metal structure having a width $d_M$ of 10 mm may define a conductive path of 4 meters in one instance. After formation of the metal structure 116, a sintering anneal may be performed in some embodiments.

As detailed below, definition of the superconductor structure 118 and the metal structure 116 may be accomplished through various approaches that are compatible with high volume manufacturing. Accordingly the entire process for fabrication of the integrated superconductor device 100 may be performed using materials, processes, and equipment compatible with high volume manufacturing.

Figure 2A:
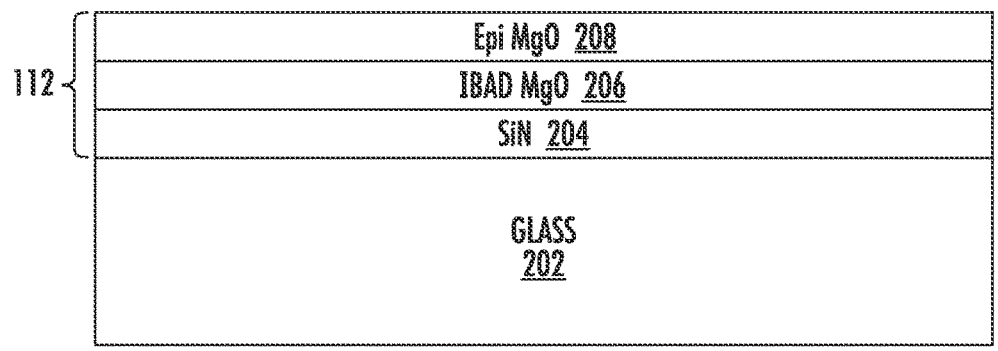
FIG. 2A depicts an exemplary layer stack for an embodiment in which a substrate includes a substrate base made of glass.

FIG. 2A depicts an exemplary layer stack that constitutes the layer 112, for an embodiment in which a substrate 200 includes a substrate base 202 made of glass. As illustrated, a layer 204 may be silicon nitride layer (SiN), which is deposited in contact with the substrate base 202 that is made of glass. In one variant the layer 204 may instead be $Y_2O_3$. In either of these variants the layer 204 may be deposited by known methods, such as sputtering, evaporation, chemical vapor deposition, or other method.

A further layer 206 is deposited upon the layer 204, which may be MgO. The MgO layer may serve as a crystalline template from which an oriented superconductor layer may subsequently be grown. In particular, the MgO layer may be deposited by ion beam assisted deposition (IBAD), which may form a crystalline MgO layer having a preferred crystallographic orientation (texture). The term "oriented superconductor layer" as used herein refers to a superconductor layer that has a preferred crystallographic orientation, such as a "c-axis" orientation.

In the embodiment of FIG. 2A, another layer 208 is formed upon the layer 206 before formation of the superconductor layer. The layer 208 may be an epitaxial MgO layer that is grown under conditions to provide a higher degree of crystalline orientation to the layer as opposed to the layer 206. In one instance the layer 208 may be grown in a separate process chamber than that used to grow the layer 206. For example, the layer 208 may be grown in a process chamber for chemical vapor deposition. In one variant, an optional epitaxial LaMnO3 layer (not shown) may be deposited upon the layer 208, for example, by reactive sputtering.

Figure 2B:
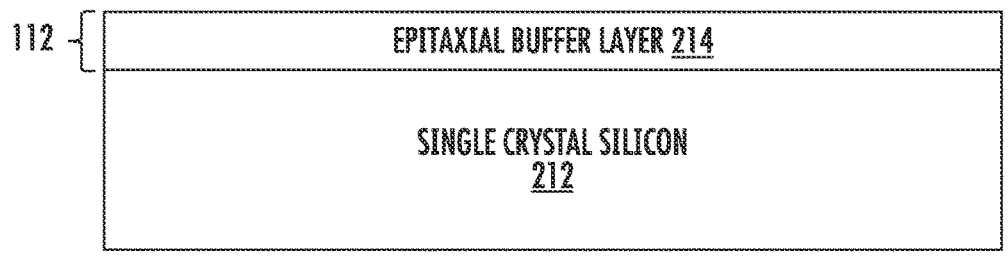
FIG. 2B depicts another variant for an embodiment in which a substrate includes a substrate base made of single crystalline silicon.

FIG. 2B depicts another variant of the layer 112, for an embodiment in which a substrate 210 includes a substrate base 212 made of single crystalline silicon. In this example the layer 112 may be embodied as an epitaxial buffer layer 114 that constitutes a single layer that grows epitaxially on the silicon substrate. Examples of this include $CeO_2$ and $CaF_2$, each of which have the face centered cubic fluorite crystal structure, which space group is directly related to that of silicon. For this reason, highly oriented or single crystalline $CaF_2$ or $CeO_2$ may be grown on silicon. In particular, the lattice parameter of $CeO_2$ exhibits merely a 0.35% lattice mismatch with that of silicon, resulting in the ability to grow epitaxial layers of $CeO_2$ directly on silicon.

Figure 3A:
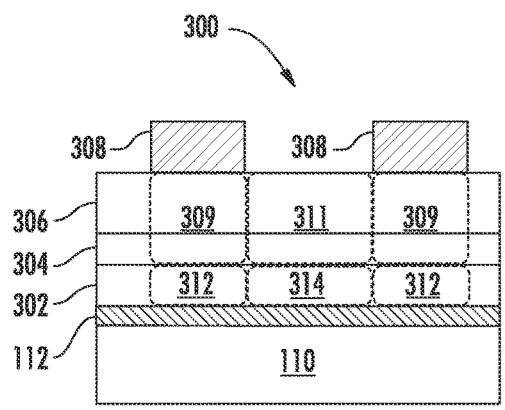
FIG. 3A and FIG. 3B depict exemplary operations involved in fabrication of an embodiment of an integrated superconductor device.

In the present embodiments an integrated superconductor device may be formed on a substrate base 110 and layer 112 in various manners. FIG. 3A shows a side cross-section of an of an integrated superconductor device 300 at an intermediate stage of formation according to various embodiments. A superconductor layer 302 is formed as a blanket layer in a manner that results in a highly oriented superconductor material having its c-axis aligned along the Z-axis and perpendicularly to the plane of the substrate base 110, that is, the X-Y plane as shown. In various embodiments, the superconductor layer 302 is made of a superconductor material having the formula $ReBa_2Cu_3O_{7-x}$ (also referred to herein as "ReBCO") where Re stands any rare earth element including Yttrium. In other embodiments the superconductor layer 302 may be a bismuth strontium calcium copper oxide (BSCCO) of the general formula $Bi_2Sr_2Ca_{n-1}Cu_nO_{2n+4+x}$; a thallium strontium calcium copper oxide (TSCCO) of the general formula $Tl_2Sr_2Ca_{n-1}Cu_nO_{2n+4+x}$; mercury strontium calcium copper oxide (MSCCO) of the general formula $HgSr_2Ca_{n-1}Cu_nO_{2n+2+x}$. The embodiments are not limited in this context.

The superconductor layer 302 may be deposited by conventional processes for depositing a superconductor material, such as reactive co-evaporation or by metal organic chemical vapor deposition (MOCVD). The embodiments are not limited in this context. Some exemplary thicknesses for the superconductor layer 302 along the Z direction range from one half micrometer to five micrometers. In some instances, for example, in the case where superconductor layer 302 is an ReBCO material, an oxygenation annealing process may be performed after deposition of the superconductor layer 302. This serves to decrease the value of "x" in the ReBCO crystal structure so that the number of oxygen atoms per unit cell approaches 7. In this case the critical temperature and critical current at 77 K may increase, as well as the critical field for the superconductor layer 302.

In various embodiments at least one metallic layer is disposed on the superconductor layer 302 such that the metallic layer has a surface that forms an interface with the superconductor layer 302. In the embodiment shown in FIG. 3A, on top of the superconductor layer 302 is disposed an intermediate metal layer 304 and a top metal layer 306. The intermediate metal layer 304 and top metal layer 306 may be formed by a conventional coating deposition method, including evaporation, sputtering, plating, chemical vapor deposition of other convenient method. In one example the intermediate metal layer 304 is silver or a silver alloy and the top metal layer 306 is copper or a copper alloy. Exemplary thicknesses for an intermediate metal layer 304 range from 0.2 micrometers to 2 micrometers, and exemplary thicknesses for top metal layer 306 range from a thickness of one micrometer to 20 micrometers. However, the embodiments are not limited in this context. In further embodiments, instead of two metal layers, a single metal layer may be used to coat the superconductor layer 302.

In various embodiments mask features are formed on a metallic layer such as the top metal layer 306. As shown in FIG. 3A, disposed on an outer surface of the top metal layer 306 is a mask layer 308 which may be formed by any convenient method. The mask layer 308 may contain mask features that define a covered portion of the metallic layer and an open portion of the metallic layer. This is shown as covered portions 309 and open portion 311, which extend through the top metal layer 306 and intermediate metal layer 304. The covered portions 309 and open portion 311 in turn cover the protected portion 312 and exposed portion 314, respectively, of the superconductor layer 302.

In some embodiments the mask layer 308 may be a photoresist material formed by conventional photolithographic techniques. Following the example of FIG. 1A, the mask layer 308 may have a serpentine pattern in the X-Y plane as exhibited by the superconductor tape 104. The mask layer 308 may be used as an etch mask that defines protected portions of the integrated superconductor device 300 while permitting etching in exposed portions unprotected by the mask layer 308. Thus, the mask layer 308 acts to define regions to form a superconductor tape such as the superconductor tape 104 that include the covered portions 309 of the top metal layer 306 and intermediate metal layer 304, as well as protected portions 312 of the superconductor layer. In so doing, the mask layer 308 defines regions to be etched away including the open portion 311 and exposed portion 314 of the superconductor layer 302.

Figure 3B:
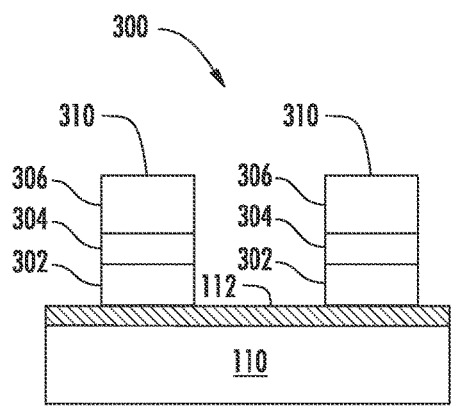

FIG. 3B illustrates the structure of the integrated superconductor device 300 at a subsequent stage of processing after etching has been performed in the presence of the mask layer 308. The integrated superconductor device 300 may, for example, be subjected to one or more etch processes that remove the open portion 311 including portions of the top metal layer 306, intermediate metal layer 304, and exposed portion 314 of superconductor layer 302. As illustrated in FIG. 3B a set of etched structures 310 are formed, in which the top metal layer 306, intermediate metal layer 304, and superconductor layer 302 are etched to the layer 112. In one example, the etched structures 310 represent a variant of the superconductor tape 104 and may represent cross-sectional portions of two different portions of the same serpentine tape structure, as shown in FIG. 1A. However, in other embodiments, the etched structures may represent other integrated superconductor features that are formed integrally within a substrate.

An advantage of the embodiments generally represented by FIGS. 3A and 3B is that an integrated superconductor structure, which may be used to form a superconductor tape, can be formed by using high volume manufacturing processes such as those used to manufacture semiconductor based integrated circuit devices. This allows an integrated superconductor device having a long electrical path length to be conveniently formed in a desired substrate, such as a commercially available silicon substrate, glass substrate, sapphire substrate, or other substrate. Because unlike freestanding superconductor tapes, the tape-like structure is integrated within a substrate such as the substrate base 110. Referring again to FIG. 1A, the resulting integrated substrate structure may be more mechanically stable than tapes and easier to handle for assembly into other structures, such as when multiple integrated superconductor devices 100 are connected together.

Figure 4A:
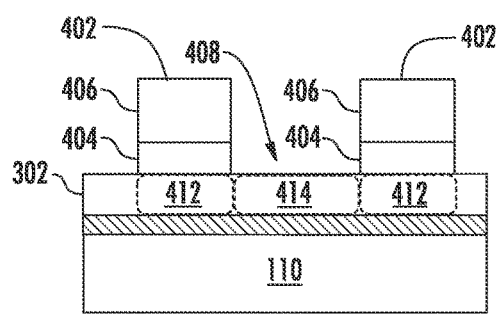
FIG. 4A and FIG. 4B depict further exemplary operations involved in fabrication of another embodiment of an integrated superconductor device.
Figure 4B:
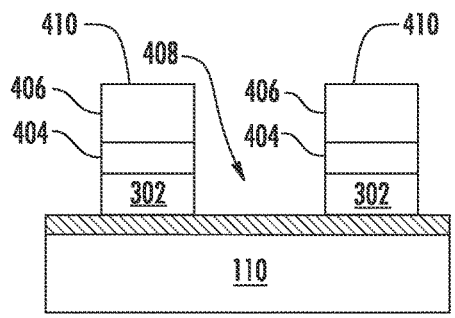

FIGS. 4A and 4B illustrate different stages of processing of an integrated superconductor device according to further embodiments. In contrast to the embodiments illustrated by FIGS. 3A and 3B, in FIGS. 4A and 4B an integrated superconductor device 400 is fabricated by depositing a metallic layer on a superconductor layer in a mask pattern rather than as a blanket layer. In particular, in this approach a patterned metal structure 402 is formed directly upon a superconductor layer 302, instead of forming patterned metal structures by first depositing a blanket layer of metal(s), followed up by mask formation and etching of the blanket metal layer. In various embodiments, the patterned metal structure 402 may be formed in one or multiple steps. In the specific example illustrated in FIGS. 4A, 4B, the patterned metal structure 402 is a bilayer structure that includes an intermediate metal layer 404 and top metal layer 406, which may be formed from materials discussed above with respect to FIGS. 3A and 3B.

In various embodiments, the patterned metal structure 402 may be formed by screen printing, extrusion printing, or deposition through a mask. After formation of the patterned metal structure 402, the patterned metal structure may serve as an etch mask for the underlying superconductor layer 302. In particular, the patterned metal structure 402 acts to define protected portions 412 of the superconductor layer and exposed portions 414 of the superconductor layer 302.

Thus, the exposed portion 414 of the superconductor layer 302 may be etched by an etchant that is provided in exposed areas 408, resulting in formation of the etched structures 410, which constitute a stack of metal layers and superconductor layer etched into patterned features. An advantage of this approach is that etching of metal layers is not needed to define the final etched structures 410. In accordance with various embodiments, the etchant used to etch the superconductor layer 302 may selectively etch the superconductor layer 302 at a faster rate than etching of the patterned metal structure 402.

Figure 5:
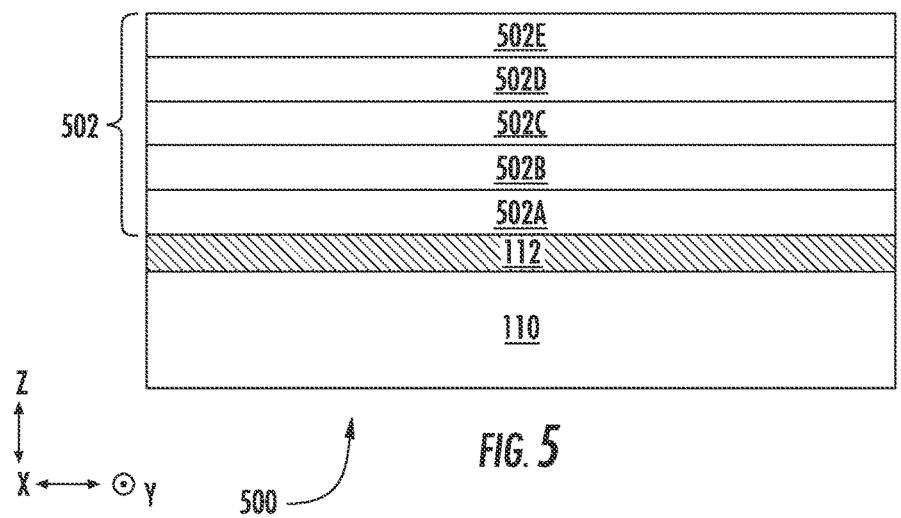
FIG. 5 depicts a side cross-sectional view of an integrated superconductor device structure consistent with further embodiments.

In further embodiments, the formation of the superconductor layer in an integrated superconductor device may be performed in a manner to reduce stress within the superconductor layer. This may be especially useful in applications such as fabrication of integrated superconductor tapes in a substrate as described above. In various embodiments a superconductor layer thickness in excess of one micrometer and sometimes in excess of two to three micrometers may be formed without the buildup of excessive stress. This is useful for applications where superconductor layer thickness of more than one half micrometer is needed to meet device requirements. FIG. 5 depicts a device stack 500 according to one embodiment. The device stack 500 may be used, for example, to form an integrated superconductor device as detailed herein above. Accordingly, in some embodiments, a further set of layers (not shown) may be deposited upon the outer surface (upper surface in FIG. 5) of the device stack 500, followed by patterning of the device stack 500. As illustrated in FIG. 5, a superconductor layer 502 is disposed upon a layer 112, which in turn is disposed on the substrate base 110. As described above, the layer 112 may serve as a template for growth of a highly crystallograpcially oriented superconductor layer, such as the superconductor layer 502.

The growth, microstructure, and properties of a superconductor layer that is deposited on a substrate may in particular be affected by the stress that may develop within the superconductor layer. A particular source of stress is thermal mismatch stress that may develop during post-deposition cool down when a superconductor film is formed at elevated temperatures on a substrate that exhibits a large mismatch in thermal expansion properties with respect to the superconductor material. For example, Si exhibits a coefficient of thermal expansion of $2.6 \times 10^{-6}$/k, while YBCO exhibits a coefficient of thermal expansion of $13.4 \times 10^{-6}$/k. Accordingly, a difference in thermal expansion coefficient between YBCO and an underlying silicon substrate is about $11 \times 10^{-6}$/k. For a deposition temperature of 800° C., which may be used to form a highly oriented YBCO layer, the thermal expansion mismatch between deposition temperature and room temperature is about $800 \times 11 \times 10^{-6}$ or about $10^{-2}$. Combined with an elastic modulus of about 150 GPa for YBCO, this thermal expansion mismatch may generate an elastic stress (thermal mismatch stress) of about 1.5 GPa in the growing YBCO layer. Accordingly, since YBCO has a higher coefficient of thermal expansion, the YBCO layer tends to build up tensile stress during cool down when formed on an underlying silicon substrate.

The results of such stress in a layer may in particular depend upon the well-known stress-thickness product, which is a product of stress within a layer and layer thickness and is expressed in units of Newton/meter. As evident, for the same thermal mismatch stress, the stress-thickness product increases linearly with increased layer thickness. Once the stress-thickness product exceeds a threshold, various deleterious effects may be observed, such as layer cracking in the superconductor layer, delamination, or other deterioration of microstructure. In YBCO growth on a substrate such as silicon, this has the effect of limiting the film thickness of a superconductor layer that can be deposited with acceptable properties and performance.

The embodiment of FIG. 5 addresses this issue by forming the superconductor layer 502 as a stack of oriented superconductor sub-layers 502A-502E. In one example, for purposes of illustration, the superconductor layer 502 may include five superconductor sub-layers as shown. The oriented superconductor sub-layers 502A-502E may have the same layer thickness or different layer thickness. In one particular example, the superconductor layer 502 has a thickness in the Z direction of 2.5 µm and each oriented superconductor sub-layer 502A, 502B, 502C, 502D, and 502E has a layer thickness of 0.5 µm. Each oriented superconductor sub-layer 502A, 502B, 502C, 502D, and 502E may be deposited in a separate deposition performed at elevated temperature followed by cool down to room temperature. During this cool down, the thermal mismatch stress may at least in part be relieved without film cracking. Thus, each oriented superconductor sub-layer 502A-502E may be deposited in a deposition cycle in which the layer stress is relieved before formation of a subsequent layer. In the embodiment of FIG. 5 five different deposition cycles may be performed. However in some additional embodiments at least three deposition cycles may be performed. Even if stress relief is incomplete, this may result in the ability to grow a much thicker overall superconductor layer before stress buildup results in deterioration such as cracking It is to be noted that in some embodiments, the deposition cycle need not involve cooling to room temperature. In particular embodiments, a deposition cycle includes depositing a first oriented superconductor layer on the intermediate layer at a first substrate temperature and cooling the substrate to a second substrate temperature less than the first substrate temperature. For example, the first substrate temperature may be greater than 700° C., while the second substrate temperature is 100° C. This may allow a more rapid deposition cycle while still benefitting by achieving stress relief from cooling the substrate between depositions by more than 600° C.

Figure 6:
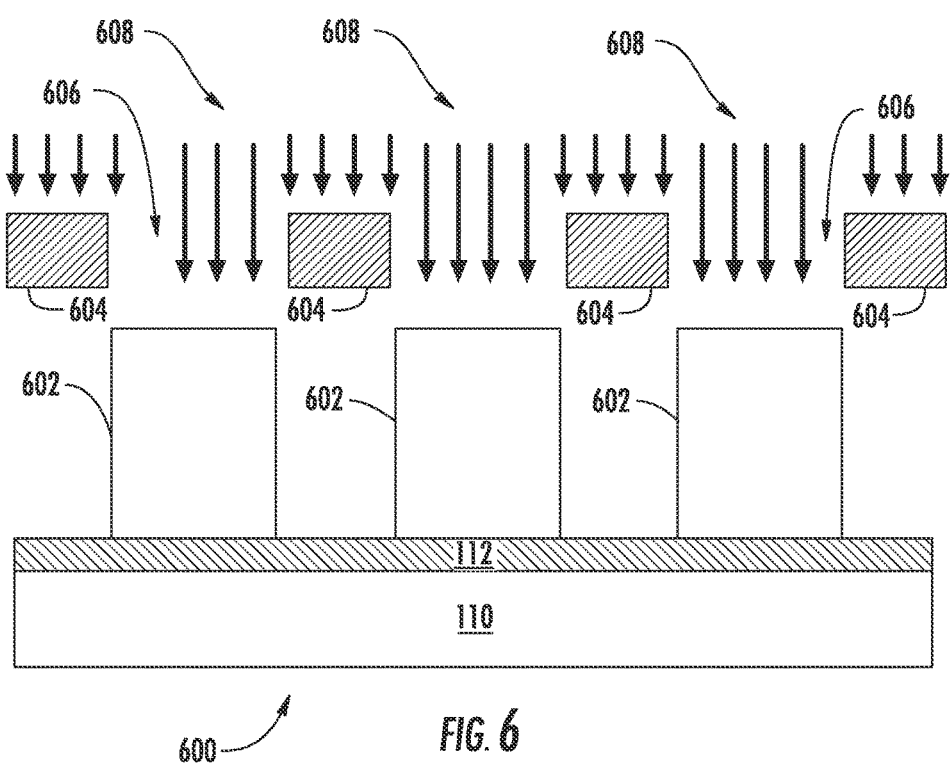
FIG. 6 depicts a side cross-sectional view of a formation of an integrated superconductor device structure consistent with still additional embodiments.

FIG. 6 depicts another embodiment of formation of an integrated superconductor structure 600 that may reduce overall stress in the superconductor portion of an integrated superconductor device. In this embodiment, superconductor structures 602 are deposited directly through open areas 606 of a shadow mask 604 that is provided proximate the surface of the layer 112 to block superconductor formation on portions of the layer 112 so that a non-continuous layer is formed. For example, superconductor precursors 608 may be provided in the gas phase by reactive evaporation or other technique such that depositing species of the superconductor precursors are screened by the shadow mask 604 except in the open areas that transmit the superconductor precursors 608 to condense on the layer 112. An oriented superconductor layer may be formed by maintaining the integrated superconductor structure 600 at a substrate temperature greater than 700° C. Because the superconductor material does not deposit as a continuous layer but in the form of narrower features, superconductor structures 602, defined by the size of the open areas 606, stress may be relieved on sidewalls of the superconductor structures 602, which may be sufficient to avoid cracking In some embodiments, the width of features along the X-direction, for example, may be 100 µm (0.1 mm) to 5 mm, while the layer thickness along the Z-direction is one micrometer to six micrometers. The embodiments are not limited in this context, however.

It is to be noted that in some embodiments, subsequently to the deposition of the superconductor structures 602, a metal layer (not shown) may be deposited on the superconductor structures 602 to form a superconductor tape. For example, the shadow mask 604 may be used to define a metal pattern of a metal layer to overly the superconductor structures 602.

Figures 7A, 7B:
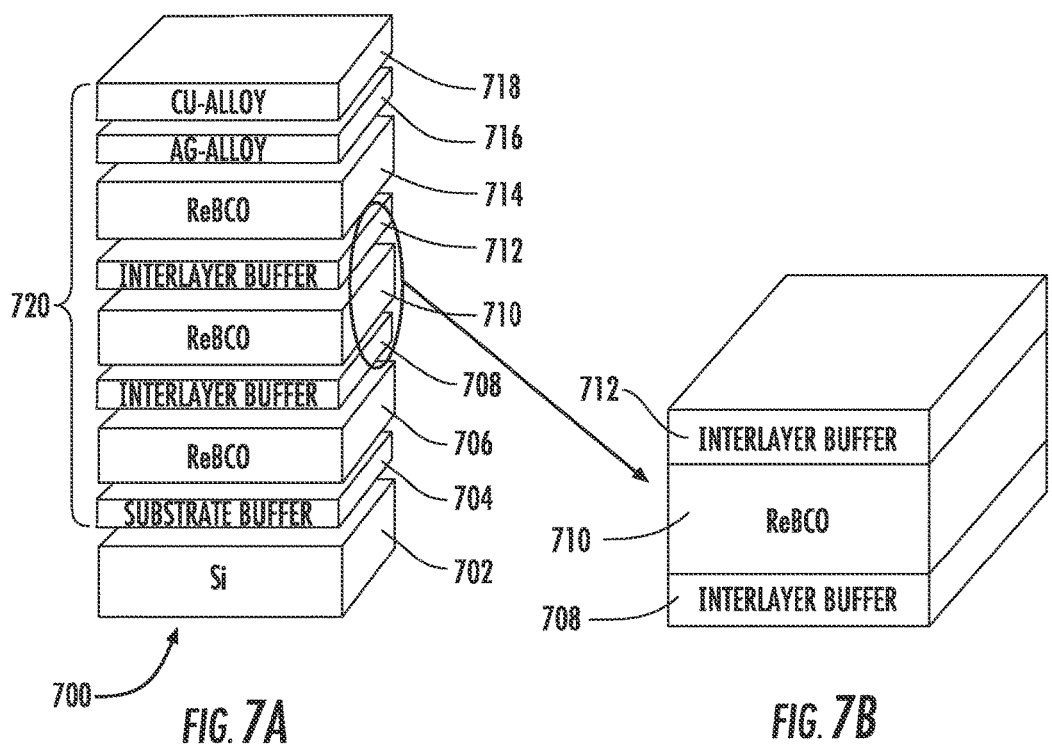
FIG. 7A depicts an exploded isometric view of an integrated superconductor device structure according to still further embodiments.
FIG. 7B depicts a magnified view of a portion of the integrated device structure of FIG. 7A.

FIG. 7A depicts an exploded isometric view of an integrated superconductor device structure 700 according to still further embodiments; and FIG. 7B depicts a magnified view of a portion of the integrated device structure of FIG. 7A. The integrated superconductor device structure 700 is a layer stack that includes a series of layers built upon a silicon substrate 702. Embodiments arranged according to the integrated superconductor device structure 700 address several issues that arise in forming superconductor layers on substrates, including providing higher critical current, better oxygen stochiometry in the superconductor layer, and better flux pinning Presently, YBCO or ReBCO films that are grown on a substrate such as, for example, stainless steel exhibit a large and rapid decrease in critical current as thickness of the superconductor layer increases. In the integrated superconductor device structure 700 the ReBCO material is arranged not as a single layer, but as sub-layers that form a series of distinct and separate layers. A first sub-layer constitutes a first oriented superconductor layer, a second sub-layer constitutes a second oriented superconductor layer, and so forth. A buffer layer is interposed between successive oriented superconductor layers. In this way the thickness of any given superconductor sub-layer may be limited to within a range that provides better properties, while providing an overall ReBCO thickness that meets a target requirement. As illustrated, a substrate buffer layer 704 is formed on the silicon substrate 702. This substrate buffer layer may be $CeO_2$, $CaF_2$, or other appropriate buffer layer suitable as a template for oriented growth of a first ReBCO layer 706. A first interlayer buffer layer 708 is disposed on the first ReBCO layer, followed by a second ReBCO layer 710, second interlayer buffer layer 712, and third ReBCO layer 714. On top of this is formed a silver shunt layer 716 and finally a copper overlayer 718.

In various embodiments, each ReBCO layer may have a thickness of one micrometer to four micrometers and in some examples 2-3 µm. As noted previously, the substrate buffer layer 704 may have functions such as preventing Si diffusion in the ReBCO layer, providing a crystalline template for oriented growth of the ReBCO layer, and decreasing lattice mismatch. Some examples of the substrate buffer layer include YSZ/$CeO_2$ metal oxide bilayer, or a silicide with the appropriate crystalline structure that matches with ReBCO. The first interlayer buffer layer 708 and second interlayer buffer layer 712 may function to recover desired structures and to introduce surface pinning to an adjacent superconductor layer. An appropriate buffer layer material of these interlayer buffer layers is metal oxide-based crystalline material, such as $LaMnO_3$, YSZ, $SrTiO_3$, $CeO_2$, MgO, and so forth. More generally, excellent lattice matching with ReBCO is a criterion from which to choose the buffer layer material. Examples of interlayer buffer layer material than may provide enhanced pinning include materials in the $BaZrOx$ or, $BaTaOx$ families. In some embodiments, the interlayer buffer layer thickness ranges from a thickness of 2 nm to 50 nm. The embodiments are not limited in this context. In particular embodiments, the first interlayer buffer layer 708 and second interlayer buffer layer 712 may be quasi-continuous, in which each layer forms a mostly continuous microstructure that separates successive ReBCO layers from one another and prevents grain growth, but has some porosity of gaps that provide some connectivity between successive ReBCO layers. This may aid in the ability of one ReBCO layer to serve as a shunt for the next ReBCO layer.

In some embodiments, the first interlayer buffer layer 708 and second interlayer buffer layer 712 may be a single layer which may improve recovery of the desirable lattice parameter so that a-axis growth in the ReBCO layers is suppressed. In other embodiments, the first interlayer buffer layer 708 and second interlayer buffer layer 712 may be multilayered or multiphase to improve both the lattice structure and to enhance flux pinning properties.

A further advantage provided by the integrated superconductor device structure 700 is the improved oxidation of the ReBCO material. For thick ReBCO films it may be difficult to oxygenate the entire layer when annealing in an oxygen containing environment due to diffusion limitations. This may result in a lack of oxygen in portions of the ReBCO films or an oxygen gradient that causes a degradation in critical current for a given layer. The layer structure provided by the integrated superconductor device structure 700 locates an ReBCO layer between two other oxide layers. Thus, oxygen distribution in the ReBCO layer is bounded by the oxide layer, reducing the oxygen gradient.

Although FIG. 7A and 7B depict an embodiment in which the substrate is silicon, other embodiments may use other substrates such as glass, sapphire or other substrate compatible for growing a highly oriented superconductor layer. Moreover, other embodiments may include any number of ReBCO layers interspersed by oxide layers. It is also to be noted that in some embodiments the stack of layers 720 shown in FIG. 7A may be arranged on the silicon substrate 702 in a pattern such as a tape structure as described above.

Although the aforementioned embodiments have explicitly shown examples of conductive strips arranged in serpentine patterns to form superconductor tapes, in other embodiments different patterns may be used to form an integrated superconductor device. For example, a conductive strip may be arranged in various non-linear patterns, where a non-linear pattern refers to a strip that is not arranged in a single straight line. Examples of non-linear patterns include spiral patterns or other complex patterns.

In summary, the present embodiments provide multiple advantages over conventional superconductor tape technology in which superconductor tapes are fabricated as free standing tape structures. For one, the integration of a tape structure into a large area smooth substrate provides a more robust process for fabricating superconductive devices with reproducible properties. This is in part due to the smoothness of such substrates as compared to metal tapes used as substrates for conventional superconductor tapes. Moreover, the integrated superconductor devices may be fabricated in conventional processing apparatus used for high volume manufacturing such as semiconductor manufacturing, and may employ conventional substrates such as silicon wafers, sapphire wafers, glass substrates, and so forth. Additionally, the design parameters of superconductor devices may be conveniently adjusted by simply varying layout of the metal structure, for example, by varying design pattern of the metal structure, width of the metal structure, spacing between adjacent metal structure lines, and so forth. In addition, the etching and patterning processes of superconductor structures disclosed herein are compatible with high volume manufacturing. Moreover, the present embodiments provide novel techniques to reduce stress in superconductor layers.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A method to form a superconductor device, comprising:
   depositing a crystalline layer having a preferred crystallographic orientation on a substrate;
   forming an oriented superconductor layer comprising an oriented superconductor material on the crystalline layer;
   forming a metallic layer on the superconductor layer;

providing a mask proximate the substrate to define a protected portion of the oriented superconductor layer and an exposed portion of the oriented superconductor layer; and removing the exposed portion of the oriented superconductor layer without etching the protected portion of the oriented superconductor layer, wherein the forming the oriented superconductor layer comprises:

performing a deposition process to form a first oriented superconductor sub-layer; and repeating the deposition process to form a second oriented superconductor sub-layer, directly upon the first oriented superconductor sub-layer, wherein the performing the deposition process further comprises:

depositing a given oriented superconductor sub-layer at a first substrate temperature; and cooling the substrate to a second substrate temperature less than the first substrate temperature, wherein the first substrate temperature comprises a temperature of 700° C. or more, wherein the second temperature is greater than room temperature.

2. The method of claim 1, wherein the providing the mask comprises:

forming the metallic layer as a blanket layer having a surface that forms an interface with the oriented superconductor layer; and forming mask features on the metallic layer that define a covered portion of the metallic layer and open portion of the metallic layer that cover the protected portion and exposed portion of the superconductor layer, respectively.

3. The method of claim 2, further comprising removing the open portion of the metallic layer without etching the covered portion of the metallic layer.

4. The method of claim 2, wherein the protected portion of the oriented superconductor layer and the covered portion of the metallic layer comprise a superconductor tape structure that defines a serpentine shape on the substrate.

5. The method of claim 1, wherein providing the mask comprises depositing the metallic layer on the oriented superconductor layer in a mask pattern that defines the protected portion and exposed portion of the superconductor layer.

6. The method of claim 1, further comprising forming the crystalline layer as an epitaxial MgO layer that is formed on a stack of layers disposed between the epitaxial MgO layer and the substrate.

7. The method of claim 1, wherein the substrate comprises monocrystalline silicon, and wherein the crystalline layer comprises $CeO_2$ or $CaF_2$.

8. The method of claim 1, wherein the depositing the given oriented superconductor sub-layer at the first substrate temperature and cooling the substrate to the second substrate temperature comprises a deposition cycle, wherein the method further comprises performing at least three deposition cycles.

9. The method of claim 1, wherein the interlayer buffer layer is $CeO_2$ or $CaF_2$.

10. A method for forming a superconductor device, comprising:

forming a crystalline layer having a preferred crystallographic orientation on a substrate;

providing a mask proximate a surface of the crystalline layer, the mask comprising an open area, wherein the mask is not in contact with the substrate; and directing superconductor precursors through open areas of the mask to the substrate to the crystalline layer, wherein the superconductor precursors form an orientated superconductor layer on the crystalline layer in exposed portions of the substrate adjacent the open area, and not covered by the mask, wherein the forming the oriented superconductor layer comprises:

performing a deposition process to form a first oriented superconductor sub-layer; and repeating the deposition process to form a second oriented superconductor sub-layer, directly upon the first oriented superconductor sub-layer, wherein the performing the deposition process further comprises:

depositing a given oriented superconductor sub-layer at a first substrate temperature; and cooling the substrate to a second substrate temperature less than the first substrate temperature, wherein the first substrate temperature comprises a temperature of 700° C. or more, wherein the second temperature is greater than room temperature.

11. The method of claim 10 wherein the mask defines a serpentine pattern, and wherein a superconductor structure having the serpentine pattern is formed on the crystalline layer.

12. The method of claim 10, wherein the orientated superconductor layer comprises $ReBa_2Cu_3O_{7-x}$ where Re stands for yttrium or any rare earth element.

13. The method of claim 10, wherein the oriented superconductor layer comprises thickness of one micrometer to six micrometers and a width of 0.1 mm to 5 mm.

* * * * *